United States Patent
Hong et al.

(10) Patent No.: US 9,006,093 B2
(45) Date of Patent: Apr. 14, 2015

(54) NON-VOLATILE MEMORY (NVM) AND HIGH VOLTAGE TRANSISTOR INTEGRATION

(71) Applicants: Cheong Min Hong, Austin, TX (US);
Sung-Taeg Kang, Austin, TX (US);
Jane A. Yater, Austin, TX (US)

(72) Inventors: Cheong Min Hong, Austin, TX (US);
Sung-Taeg Kang, Austin, TX (US);
Jane A. Yater, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/928,666

(22) Filed: Jun. 27, 2013

(65) Prior Publication Data
US 2015/0001612 A1 Jan. 1, 2015

(51) Int. Cl.
*H01L 29/788* (2006.01)
*H01L 29/792* (2006.01)
*H01L 29/66* (2006.01)

(52) U.S. Cl.
CPC ........ *H01L 29/792* (2013.01); *H01L 29/66833* (2013.01)

(58) Field of Classification Search
USPC .................. 257/316–330; 438/129, 591, 593
See application file for complete search history.

(56) References Cited

U.S. PATENT DOCUMENTS

| | | | |
|---|---|---|---|
| 5,614,746 A | 3/1997 | Hong et al. | |
| 6,087,225 A | 7/2000 | Bronner et al. | |
| 6,194,301 B1 | 2/2001 | Radens et al. | |
| 6,235,574 B1 | 5/2001 | Tobben et al. | |
| 6,333,223 B1 | 12/2001 | Moriwaki et al. | |
| 6,388,294 B1 | 5/2002 | Radens et al. | |
| 6,509,225 B2 | 1/2003 | Moriwaki et al. | |
| 6,531,734 B1 | 3/2003 | Wu | |
| 6,635,526 B1 | 10/2003 | Malik et al. | |
| 6,707,079 B2 | 3/2004 | Satoh et al. | |
| 6,777,761 B2 | 8/2004 | Clevenger et al. | |
| 6,785,165 B2 | 8/2004 | Kawahara et al. | |
| 6,939,767 B2 | 9/2005 | Hoefler et al. | |
| 7,154,779 B2 | 12/2006 | Mokhlesi et al. | |
| 7,183,159 B2 | 2/2007 | Rao et al. | |
| 7,190,022 B2 | 3/2007 | Shum et al. | |
| 7,202,524 B2 | 4/2007 | Kim et al. | |
| 7,208,793 B2 | 4/2007 | Bhattacharyya | |
| 7,256,125 B2 | 8/2007 | Yamada et al. | |
| 7,271,050 B2 | 9/2007 | Hill | |
| 7,365,389 B1 | 4/2008 | Jeon et al. | |
| 7,391,075 B2 | 6/2008 | Jeon et al. | |

(Continued)

FOREIGN PATENT DOCUMENTS

WO 2009058486 5/2009

OTHER PUBLICATIONS

Office Action mailed Dec. 24, 2013 in U.S. Appl. No. 13/790,225.
(Continued)

*Primary Examiner* — Mamadou Diallo

(57) ABSTRACT

A method of making a semiconductor structure includes forming a select gate stack on a substrate. The substrate includes a non-volatile memory (NVM) region and a high voltage region. The select gate stack is formed in the NVM region. A charge storage layer is formed over the NVM region and the high voltage region of the substrate. The charge storage layer includes charge storage material between a bottom layer of dielectric material and a top layer of dielectric material. The charge storage material in the high voltage region is oxidized while the charge storage material in the NVM region remains unoxidized.

15 Claims, 8 Drawing Sheets

(56) References Cited

U.S. PATENT DOCUMENTS

| | | |
|---|---|---|
| 7,402,493 B2 | 7/2008 | Oh et al. |
| 7,405,968 B2 | 7/2008 | Mokhlesi et al. |
| 7,439,134 B1 | 10/2008 | Prinz et al. |
| 7,476,582 B2 | 1/2009 | Nakagawa et al. |
| 7,521,314 B2 | 4/2009 | Jawarani et al. |
| 7,524,719 B2 | 4/2009 | Steimle et al. |
| 7,544,490 B2 | 6/2009 | Ferrari et al. |
| 7,544,980 B2 | 6/2009 | Chindalore et al. |
| 7,544,990 B2 | 6/2009 | Bhattacharyya |
| 7,560,767 B2 | 7/2009 | Yasuda et al. |
| 7,745,344 B2 | 6/2010 | Chindalore |
| 7,795,091 B2 | 9/2010 | Winstead et al. |
| 7,799,650 B2 | 9/2010 | Bo et al. |
| 7,816,727 B2 | 10/2010 | Lai et al. |
| 7,821,055 B2 | 10/2010 | Loiko et al. |
| 7,906,396 B1 | 3/2011 | Chiang et al. |
| 7,932,146 B2 | 4/2011 | Chen et al. |
| 7,989,871 B2 | 8/2011 | Yasuda |
| 7,999,304 B2 | 8/2011 | Ozawa et al. |
| 8,017,991 B2 | 9/2011 | Kim et al. |
| 8,043,951 B2 | 10/2011 | Beugin et al. |
| 8,063,434 B1 | 11/2011 | Polishchuk et al. |
| 8,093,128 B2 | 1/2012 | Koutny et al. |
| 8,138,037 B2 | 3/2012 | Chudzik et al. |
| 8,168,493 B2 | 5/2012 | Kim |
| 8,298,885 B2 | 10/2012 | Wei et al. |
| 8,334,198 B2 | 12/2012 | Chen et al. |
| 8,372,699 B2 | 2/2013 | Kang et al. |
| 8,389,365 B2 | 3/2013 | Shroff et al. |
| 8,399,310 B2 | 3/2013 | Shroff et al. |
| 8,524,557 B1 | 9/2013 | Hall et al. |
| 8,536,006 B2 | 9/2013 | Shroff et al. |
| 8,536,007 B2 | 9/2013 | Shroff et al. |
| 8,679,927 B2 | 3/2014 | Ramkumar et al. |
| 8,871,598 B1 | 10/2014 | Perera |
| 2001/0049166 A1 | 12/2001 | Peschiaroli et al. |
| 2002/0061616 A1 | 5/2002 | Kim et al. |
| 2003/0022434 A1 | 1/2003 | Taniguchi et al. |
| 2004/0075133 A1 | 4/2004 | Nakagawa et al. |
| 2004/0262670 A1 | 12/2004 | Takebuchi et al. |
| 2005/0145949 A1 | 7/2005 | Sadra et al. |
| 2006/0038240 A1 | 2/2006 | Tsutsumi et al. |
| 2006/0046449 A1 | 3/2006 | Liaw |
| 2006/0099798 A1 | 5/2006 | Nakagawa |
| 2006/0134864 A1 | 6/2006 | Higashitani et al. |
| 2006/0211206 A1 | 9/2006 | Rao et al. |
| 2006/0221688 A1 | 10/2006 | Shukuri et al. |
| 2007/0037343 A1 | 2/2007 | Colombo et al. |
| 2007/0077705 A1 | 4/2007 | Prinz et al. |
| 2007/0115725 A1 | 5/2007 | Pham et al. |
| 2007/0215917 A1 | 9/2007 | Taniguchi |
| 2007/0224772 A1 | 9/2007 | Hall et al. |
| 2007/0249129 A1 | 10/2007 | Hall et al. |
| 2007/0264776 A1 | 11/2007 | Dong et al. |
| 2008/0029805 A1 | 2/2008 | Shimamoto et al. |
| 2008/0050875 A1 | 2/2008 | Moon et al. |
| 2008/0067599 A1 | 3/2008 | Tsutsumi et al. |
| 2008/0105945 A1 | 5/2008 | Steimle et al. |
| 2008/0121983 A1 | 5/2008 | Seong et al. |
| 2008/0128785 A1 | 6/2008 | Park et al. |
| 2008/0145985 A1 | 6/2008 | Chi |
| 2008/0185635 A1 | 8/2008 | Yanagi et al. |
| 2008/0237690 A1 | 10/2008 | Anezaki et al. |
| 2008/0237700 A1 | 10/2008 | Kim et al. |
| 2008/0283900 A1 | 11/2008 | Nakagawa et al. |
| 2008/0290385 A1 | 11/2008 | Urushido |
| 2008/0308876 A1 | 12/2008 | Lee et al. |
| 2009/0050955 A1* | 2/2009 | Akita et al. .................. 257/324 |
| 2009/0065845 A1 | 3/2009 | Kim et al. |
| 2009/0072274 A1 | 3/2009 | Knoefler et al. |
| 2009/0078986 A1 | 3/2009 | Bach |
| 2009/0101961 A1 | 4/2009 | He et al. |
| 2009/0111229 A1 | 4/2009 | Steimle et al. |
| 2009/0179283 A1 | 7/2009 | Adams et al. |
| 2009/0225602 A1 | 9/2009 | Sandhu et al. |
| 2009/0256211 A1 | 10/2009 | Booth, Jr. et al. |
| 2009/0269893 A1 | 10/2009 | Hashimoto et al. |
| 2009/0273013 A1 | 11/2009 | Winstead et al. |
| 2009/0278187 A1 | 11/2009 | Toba |
| 2011/0031548 A1 | 2/2011 | White et al. |
| 2011/0095348 A1 | 4/2011 | Chakihara et al. |
| 2011/0204450 A1 | 8/2011 | Moriya |
| 2011/0260258 A1 | 10/2011 | Zhu et al. |
| 2012/0034751 A1 | 2/2012 | Ariyoshi et al. |
| 2012/0104483 A1 | 5/2012 | Shroff et al. |
| 2012/0132978 A1 | 5/2012 | Toba et al. |
| 2012/0142153 A1 | 6/2012 | Jeong |
| 2012/0248523 A1* | 10/2012 | Shroff et al. .................. 257/316 |
| 2012/0252171 A1 | 10/2012 | Shroff et al. |
| 2013/0026553 A1 | 1/2013 | Horch |
| 2013/0037886 A1 | 2/2013 | Tsai et al. |
| 2013/0065366 A1 | 3/2013 | Thomas et al. |
| 2013/0084684 A1 | 4/2013 | Ishii et al. |
| 2013/0137227 A1 | 5/2013 | Shroff et al. |
| 2013/0171785 A1 | 7/2013 | Shroff et al. |
| 2013/0171786 A1 | 7/2013 | Shroff et al. |
| 2013/0178027 A1 | 7/2013 | Hall et al. |
| 2013/0178054 A1 | 7/2013 | Shroff et al. |
| 2013/0264633 A1 | 10/2013 | Hall et al. |
| 2013/0264634 A1 | 10/2013 | Hall et al. |
| 2013/0267072 A1 | 10/2013 | Hall et al. |
| 2013/0267074 A1 | 10/2013 | Hall et al. |
| 2013/0323922 A1* | 12/2013 | Shen et al. .................. 438/591 |
| 2014/0035027 A1* | 2/2014 | Chakihara et al. ............ 257/326 |
| 2014/0050029 A1* | 2/2014 | Kang et al. ................ 365/185.23 |
| 2014/0120713 A1* | 5/2014 | Shroff et al. .................. 438/593 |

OTHER PUBLICATIONS

Office Action mailed Dec. 24, 2013 in U.S. Appl. No. 13/790,014.

Office Action mailed Dec. 31, 2013 in U.S. Appl. No. 13/442,142.

Office Action mailed Jan. 16, 2014 in U.S. Appl. No. 13/491,771.

Office Action—Allowance mailed Feb. 21, 2014 in U.S. Appl. No. 13/441,426.

Office Action—Allowance mailed Feb. 28, 2014 in U.S. Appl. No. 13/442,142.

Office Action—Allowance mailed Mar. 3, 2014 in U.S. Appl. No. 13/790,014.

Office Action—Allowance mailed Mar. 6, 2014 in U.S. Appl. No. 13/491,771.

Office Action—Allowance mailed Mar. 11, 2014 in U.S. Appl. No. 13/907,491.

Office Action—Allowance mailed Mar. 12, 2014 for U.S. Appl. No. 13/790,225.

Krishnan, S., et al., "A Manufacturable Dual Channel (Si and SiGe) High-K Metal Gate CMOS Technology with Multiple Oxides for High Performance and Low Power Applications", IEEE, Feb. 2011 IEEE International Electron Devices Meeting (IEDM), pp. 28.1.1-28.1.4.

Chen, J.H., et al., "Nonvolatile Flash Memory Device Using Ge Nanocrystals Embedded in HfAlO High-k Tunneling and Control Oxides: Device Fabrication and Electrical Performance", IEEE Transactions on Electron Devices, vol. 51, No. 11, Nov. 2004, pgs. 1840-1848.

Kang, T.K., et al., "Improved characteristics for Pd nanocrystal memory with stacked HfAlO-SiO2 tunnel layer", Sciencedirect.com, Solid-State Electronics, vol. 61, Issue 1, Jul. 2011, pp. 100-105, http://wwww.sciencedirect.com/science/article/pii/S0038110111000803.

Krishnan, S., et al., "A Manufacturable Dual Channel (Si and SiGe) High-K Metal Gate CMOS Technology with Multiple Oxides for High Performance and Low Power Applications", IEEE, Feb. 2011 IEEE International Electron Devices Meeting (IEDM), 28.1.1-28.1.4, pp. 634-637.

Lee, J.J., et al., "Theoretical and Experimental Investigation of Si Nanocrystal Memory Device with HfO2 High-K Tunneling Dielectric", IEEE Transactions on Electron Devices, vol. 50, No. 10, Oct. 2003, pp. 2067-2072.

Liu, Z., et al., "Metal Nanocrystal Memories—Part I: Device Design and Fabrication", IEEE Transactions on Electron Devices, vol. 49, No. 9, Sep. 2002, pp. 1606-1613.

(56) References Cited

OTHER PUBLICATIONS

Mao, P., et al., "Nonvolatile memory devices with high density ruthenium nanocrystals", Applied Physics Letters, vol. 93, Issue 24, Electronic Transport and Semiconductors, 2006.
Mao, P., et al., "Nonvolatile Memory Characteristics with Embedded high Density Ruthenium Nanocrystals", http://iopscience.iop.org/0256-307X/26/5/056104, Chinese Physics Letters, vol. 26, No. 5, 2009.
Pei, Y., et al., "MOSFET nonvolatile Memory with High-Density Cobalt-Nanodots Floating Gate and HfO2 High-k Blocking Dielectric", IEEE Transactions of Nanotechnology, vol. 10, No. 3, May 2011, pp. 528-531.
Wang, X.P., et al., Dual Metal Gates with Band-Edge Work Functions on Novel HfLaO High-K Gate Dielectric, IEEE, Symposium on VLSI Technology Digest of Technical Papers, 2006.
U.S. Appl. No. 13/402,426, Hall, M.D., et al., "Non-Volatile Memory Cell and Logic Transistor Integration", Office Action—Allowance—May 3, 2013.
U.S. Appl. No. 13/789,971, Hall, M.D., et al, "Integration Technique Using Thermal Oxide Select Gate Dielectric for Select Gate and Replacement Gate for Logic", Office Action—Allowance—May 15, 2013.
U.S. Appl. No. 13/491,771, Hall et al, "Integrating Formation of a Replacement Ggate Transistor and A Non-Volatile Memory Cell Using a High-K Dielectric", Office Action—Rejection, Sep. 9, 2013.
U.S. Appl. No. 13/442,142, Hall, M.D., et al., "Logic Transistor and Non-Volatile Memory Cell Integration", Office Action—Ex Parte Quayle, Apr. 4, 2013.
U.S. Appl. No. 13/442,142, Hall, M.D., et al., "Logic Transistor and Non-Volatile Memory Cell Integration", Office Action—Allowance, Aug. 2, 2013.
U.S. Appl. No. 13/907,491, Hall, M.D., et al., "Logic Transistor and Non-Volatile Memory Cell Integration", Office Action—Rejection, Sep. 13, 2013.
U.S. Appl. No. 12/915,726, Shroff, M., et al., "Non-Volatile Memory and Logic Circuit Process Integration", Office Action—Restriction, Jul. 31, 2012.
U.S. Appl. No. 12/915,726, Shroff, M., et al., "Non-Volatile Memory and Logic Circuit Process Integration", Office Action—Allowance, Dec. 10, 2012.
U.S. Appl. No. 13/781,727, Shroff, M., et al., "Methods of Making Logic Transistors and non-Volatile Memory Cells", Office Action—Rejection, Aug. 22, 2013.
U.S. Appl. No. 13/077,491, Shroff, M.., et al., "Non-Volatile Memory and Logic Circuit Process Integration", Office Action—Rejection, Aug. 15, 2012.
U.S. Appl. No. 13/077,491, Shroff, M.., et al., "Non-Volatile Memory and Logic Circuit Process Integration", Office Action—Rejection, Feb. 6, 2013.
U.S. Appl. No. 13/077,491, Shroff, M.., et al., "Non-Volatile Memory and Logic Circuit Process Integration", Office Action—Allowance, Jun. 18, 2013.
U.S. Appl. No. 13/077,501, Shroff, M.., et al., "Non-Volatile Memory and Logic Circuit Process Integration", Office Action—Allowance, Nov. 26, 2012.
U.S. Appl. No. 13/313,179, Shroff, M., et al., "Method of Protecting Against Via Failure and Structure Therefor", Office Action—Rejection, Aug. 15, 2013.
U.S. Appl. No. 13/307,719, Shroff, M., et al., "Logic and Non-Volatile Memory (NVM) Integration", Office Action—Allowance, May 29, 2013.
U.S. Appl. No. 13/343,331, Shroff, M., et al., "Non-Volatile Memory (NVM) and Logic Integration", Office Action—Rejection, Mar. 13, 2013.
U.S. Appl. No. 13/343,331, Shroff, M., et al., "Non-Volatile Memory (NVM) and Logic Integration", Office Action—Allowance, Jun. 24, 2013.
U.S. Appl. No. 13/441,426, Shroff, M., et al., "Non-Volatile Memory (NVM) and Logic Integration", Office Action—Allowance, Sep. 9, 2013.
U.S. Appl. No. 13/780,574, Hall, M.D., et al., Non-Volatile Memory (NVM) and Logic Integration, Office Action—Allowance, Sep. 6, 2013.
U.S. Appl. No. 13/491,760, Shroff, M.., et al., "Integrating Formation of a Replacement Gate Transistor and a Non-Volatile Memory Cell Using an Interlayer Dielectric", Office Action—Allowance, Jul. 1, 2013.
U.S. Appl. No. 13/491,771, Hall, M., et al., "Integrating Formation of a Replacement Gate Transistor and a Non-Volatile Memory Cell Using a High-K Dielectric", filed Jun. 8, 2012.
U.S. Appl. No. 13/790,225, Hall, M., et al., "Integrating Formation of a Replacement Gate Transistor and a non-Volatile Memory Cell Having Thin Film Storage", filed Mar. 8, 2013.
U.S. Appl. No. 13/790,014, Hall, M., et al., "Integrating Formation of a Logic Transistor and a None-Volatile Memory Cell Using a Partial Replacement Gate Technique", filed Mar. 8, 2013.
U.S. Appl. No. 13/781,727, Shroff, M., et al., "Methods of Making Logic Transistors and non-Volatile Memory Cells", Office Action—Restriction, Jun. 21, 2013.
U.S. Appl. No. 13/780,591, Hall, M.D., et al., "Non-Volatile Memory (NVM) and Logic Integration", filed Feb. 28, 2013.
U.S. Appl. No. 13/491,760, Shroff, M.D., et al., "Integrating Formation of a Replacement Gate Transistor and a Non-Volatile Memory Cell Using an Interlayer Dielectric", filed Jun. 8, 2012.
U.S. Appl. No. 13/661,157, Shroff, M.D., et al., "Method of Making a Logic Transistor and a Non-Volatile Memory (NVM) Cell", file Oct. 26, 2012.
Office Action mailed Nov. 22, 2013 in U.S. Appl. No. 13/780,591.
Office Action mailed Jan. 31, 2014 in U.S. Appl. No. 13/781,727.
U.S. Appl. No. 13/781,727, Office Action—Allowance, May 12, 2014.
U.S. Appl. No. 13/343,331, Shroff, M., et al., Office Action—Allowance, mailed Nov. 8, 2013.
U.S. Appl. No. 13/441,426, Shroff, M. D., et al., Office Action—Allowance, mailed Jun. 9, 2014.
U.S. Appl. No. 13/780,591, Hall, M.D., et al., Office Action—Allowance, mailed May 12, 2014.
U.S. Appl. No. 13/907,491, Hall, Mark D., et al., Office Action—Restriction, mailed Sep. 3, 2013.
U.S. Appl. No. 13/781,727, Office Action—Restriction, Jun. 21, 2013.
U.S. Appl. No. 14/041,662, Perera, A.H., et al., Office Action—Restriction, mailed Aug. 1, 2014.
U.S. Appl. No. 13/907,491, Hall, Office Action—Rejection, mailed Sep. 3, 2013.
U.S. Appl. No. 14/041,662, Perera, Office Action—Allowance, mailed Oct. 17, 2014.
U.S. Appl. No. 13/969,180, Perera, Office Action—Allowance, mailed Aug. 5, 2014.
U.S. Appl. No. 13/781,727, Shroff, Office Action—Allowance, mailed Aug. 15, 2014.
U.S. Appl. No. 13/955,665, Perera, Office Action—Allowance, mailed Aug. 20, 2014.
U.S. Appl. No. 13/973,549, Hong, Office Action—Restriction, mailed Aug. 26, 2014.
U.S. Appl. No. 13/441,426, Shroff, Office Action—Allowance, mailed Sep. 26, 2014.
U.S. Appl. No. 13/973,549, Hong, Office Action—Allowance, mailed Nov. 14, 2014.
U.S. Appl. No. 12/915,726, Shroff, Office Action—Restriction, mailed Jul. 31, 2012.
U.S. Appl. No. 13/780,591, Hall, Office Action—Allowance, mailed Nov. 13, 2014.
U.S. Appl. No. 13/661,157, Shroff, Office Action—Restriction, mailed Oct. 2, 2014.

* cited by examiner

US 9,006,093 B2

NON-VOLATILE MEMORY (NVM) AND HIGH VOLTAGE TRANSISTOR INTEGRATION

BACKGROUND

1. Field

This disclosure relates generally to non-volatile memories (NVMs), and more particularly, integrating NVMs with high voltage transistors.

2. Related Art

The integration of non-volatile memories (NVMs) with high voltage transistors is particularly significant because NVM cells typically use significantly higher voltages for program and erase than the power supply voltage. Most of the transistors generally operate at the power supply voltage and are manufactured with that voltage in mind. The generation and use of the higher voltages required for program and erase require transistors that can operate at those higher voltages. Also, it is common for there to be a need for some ability to handle higher voltages than are used by most of the logic transistors, especially at inputs which can be from higher voltage products such as batteries and even USB inputs. This is often a situation of an analog to digital conversion. The high voltage transistors typically have a thicker gate dielectric than the vast majority of the logic transistors which can create difficulties in manufacturing. The desire is to have a high quality gate dielectric regardless of the thickness. Thermally grown oxides for this purpose are typically the highest quality gate dielectric but it is also desirable to avoid removing a layer on the gate dielectric by etching. Achieving both of these desirable characteristics can be difficult to achieve. Also there is an undesirable effect of having to grow a particularly thick oxide which consumes silicon and thus lowers the top surface of the semiconductor substrate. In etching this and other oxides, there are divots formed at the interface between the isolation regions and the active regions.

Accordingly there is a need to provide a high voltage transistor integration that improves upon one or more of the issues raised above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, an integration of a non-volatile memory (NVM) cell and a high voltage transistor includes forming the select gate structure of the NVM cell in the NVM portion and an oxidizable charge storage layer wherein the oxidizable charge storage layer extends to the region of forming the high voltage transistor. The oxidizable charge storage layer is protected for the NVM cell while being oxidized for the high voltage transistor to form a thick oxide layer. The subsequent completion of the high voltage transistor uses the thick oxide for the gate dielectric of the high voltage transistor. This is better understood by reference to the drawings the following the written description.

The semiconductor substrate described herein can be any semiconductor material or combinations of materials, such as gallium arsenide, silicon germanium, silicon-on-insulator (SOI), silicon, monocrystalline silicon, the like, and combinations of the above. Oxide layer refers to a silicon oxide layer unless otherwise noted. Similarly, nitride layer refers to a silicon nitride layer unless otherwise noted.

Figure 1:
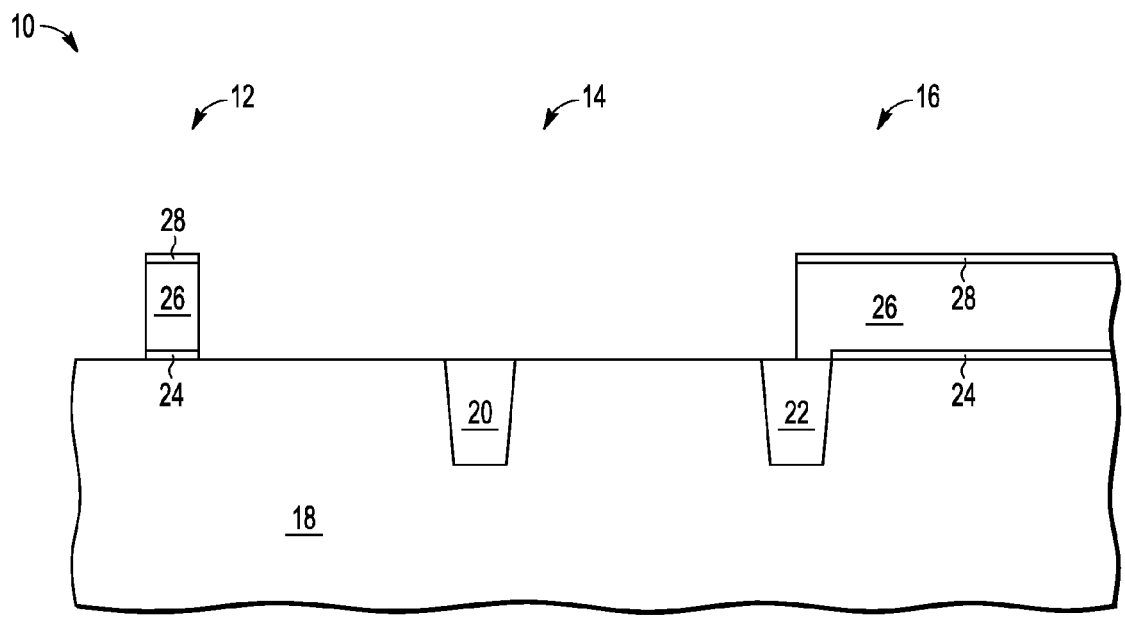
FIG. 1 is a cross section of a semiconductor structure having a non-volatile memory (NVM) structure, a high voltage transistor structure, and a logic transistor structure at a stage in processing according to an embodiment.

Shown in FIG. 1 is a semiconductor structure 10 of an integrated circuit having an NVM portion 12, a high voltage portion 14, and a logic portion 16. Semiconductor structure 10 has a substrate 18, an isolation region 20 in substrate 18 separating NVM portion 12 from high voltage portion 14, an isolation region 22 in substrate 18 separating high voltage portion 14 from logic portion 16, a dielectric layer 24 on substrate 18 in NVM portion 12 and logic portion 16 functioning as a gate dielectric in NVM portion 12, a conductive layer 26 on dielectric layer 24 in NVM portion and logic portion 16 and functioning as a select gate in NVM portion 12, and a dielectric layer 28 on conductive layer 26 in NVM portion 12 and logic portion 16. Dielectric layer 24 may be a thermal oxide that is grown rather than deposited for high quality. Dielectric layer 28 may be nitride and be used as an anti-reflective coating. Conductive layer 26 may be polysilicon that is doped to be conductive. NVM portion 12, high voltage portion 14, logic portion 16 may each be referenced as a region.

Figure 2:
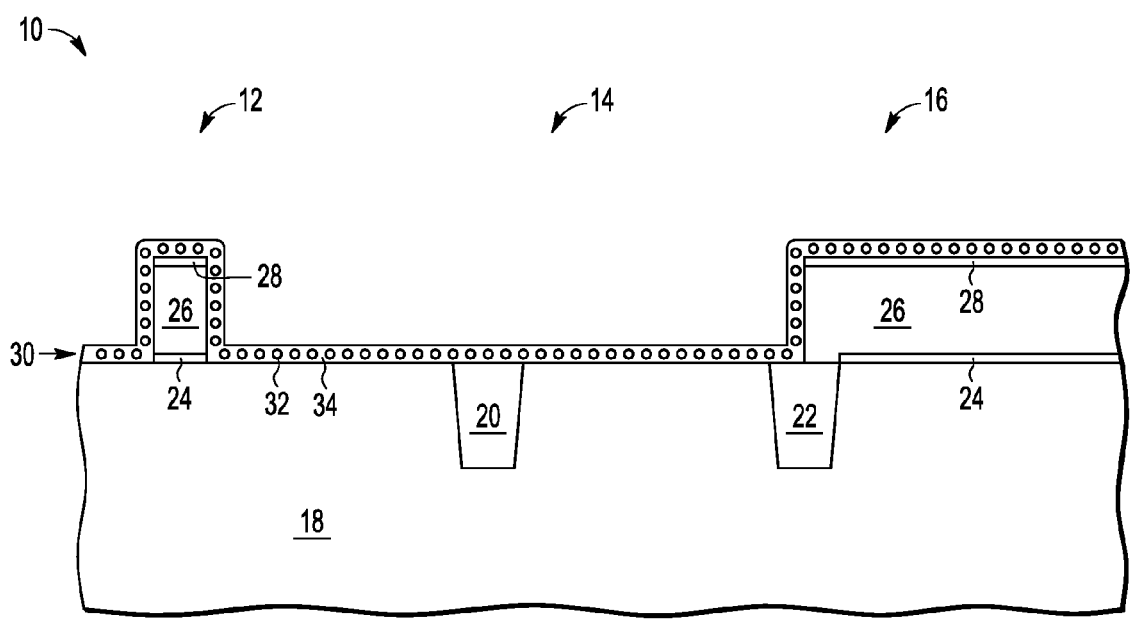
FIG. 2 is a cross section of the semiconductor structure of FIG. 1 at a subsequent stage in processing.

Shown in FIG. 2 is semiconductor structure 10 after forming a charge storage layer 30 in NVM portion 12, high voltage portion 14, and logic portion 16. Charge storage layer 30 is oxidizable. In this example, charge storage layer 30 includes a nanocrystals surrounded by oxide except where the nanocrystals are over dielectric layer 28 in which case the nanocrystals are directly on dielectric layer 28 for the case where dielectric layer 28 is nitride. In the example shown, charge storage layer 30 is formed by growing oxide, forming nanocrystals on the grown oxide, and then filling in the regions around and over the nanocrystals with deposited oxide. The nanocrystals may be silicon. An example of the nanocrystals is shown as nanocrystal 32. The dielectric, which in this example is oxide, surrounding the nanocrystals is shown as dielectric 34. Although silicon nanocrystals surruounded by oxide is believed to be preferred, some benefit may be obtained by using continuous oxidizable material such as continuous polysilicon surrounded by dielectric that may not include oxide or is some variation on oxide such as oxynitride.

Figure 3:
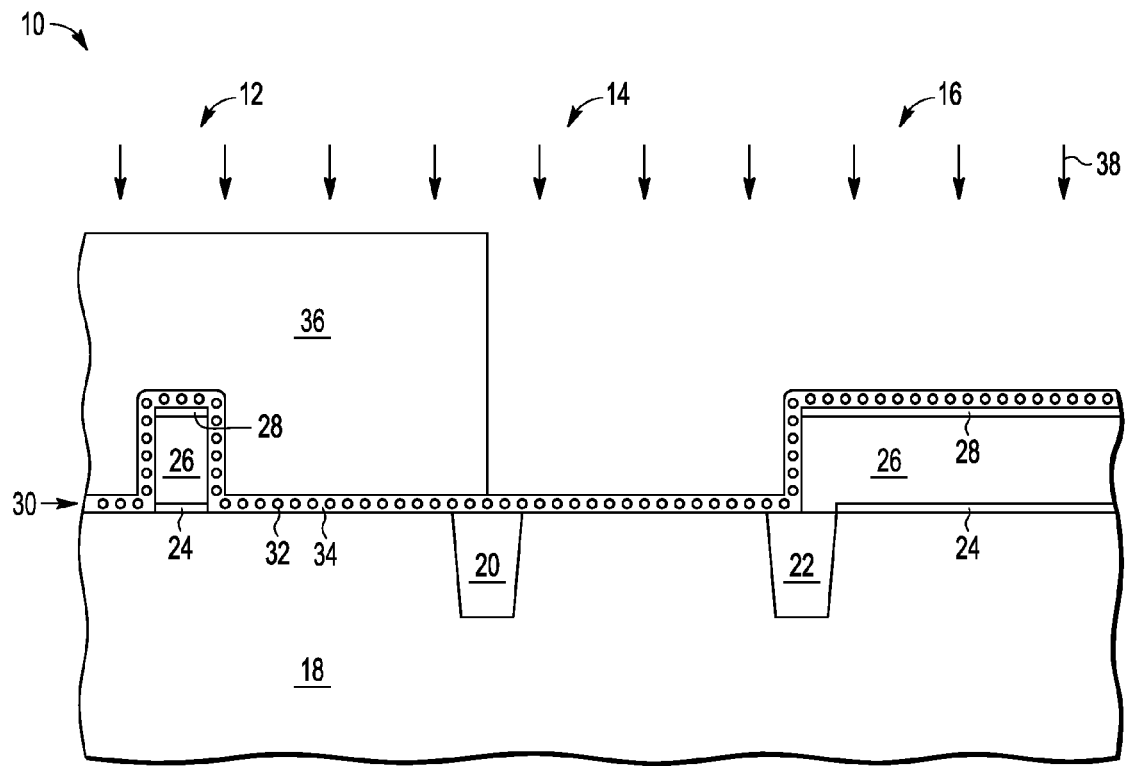
FIG. 3 is a cross section of the semiconductor structure of FIG. 2 at a subsequent stage in processing.

Shown in FIG. 3 is semiconductor structure 10 after masking NVM portion 12 with a photoresist portion 36 while exposing high voltage portion 14 and logic portion 16, and then implanting oxygen with implant 38. The energy of the implant is selected to be the depth of the nanocrystals of charge storage layer 30. The dose of the implant is preferably sufficient to fully oxidize the nanocrystals.

For the case of charge storage layer 30 having a top oxide, a nitride layer can be deposited on charge storage layer 30 prior to forming photoresist 36. Then, instead of implanting oxygen, photoresist 36 can be removed and ambient oxygen can be applied that oxidizes the nanocrystals. This leaves charge storage layer 30 in NVM portion 12 with an overlying nitride layer that will be retained so that the resulting NVM cell will have the nitride layer. Sometimes it can be beneficial to have an overlying nitride layer for the charge storage layer. This also avoids requiring an oxygen implant.

Figure 4:
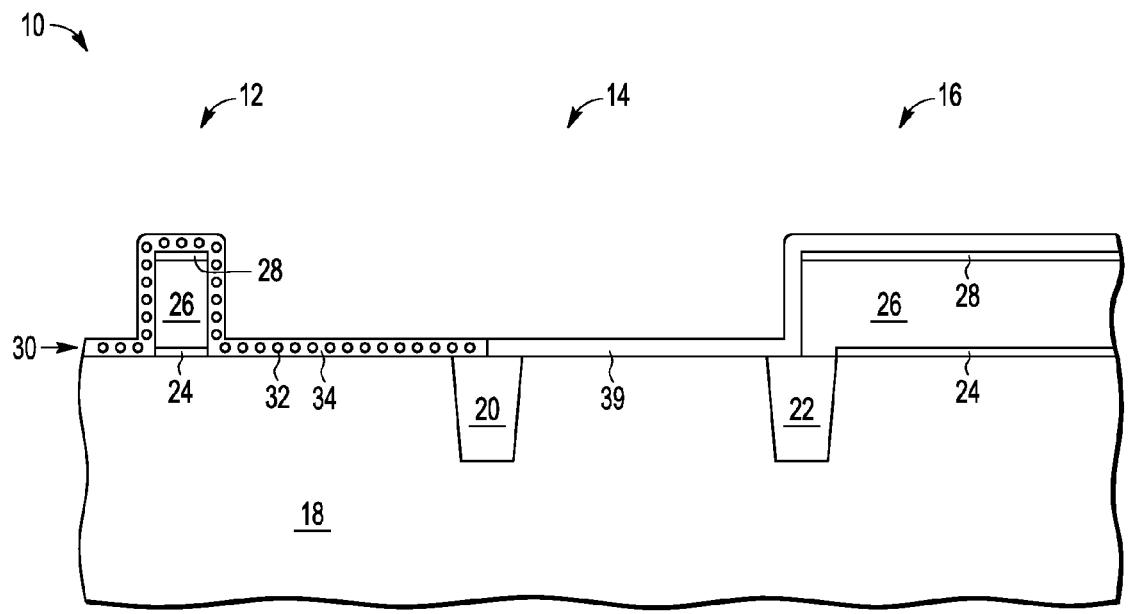
FIG. 4 is a cross section of the semiconductor structure of FIG. 3 at a subsequent stage in processing.

Shown in FIG. 4 is semiconductor structure 10 after performing an anneal sufficient to cause a reaction with the silicon nanocrystals and the implanted oxygen. This is performed at a temperature comparable to that used for growing thermal oxide. This temperature may be about 900 degrees Celsius or even more. The temperature may be sufficient to obtain a resulting oxide that is comparable quality to that of thermal oxide. The result is dielectric layer 39 that is on substrate 18 in high voltage portion 14 and over dielectric layer 28 in logic portion 16.

Figure 5:
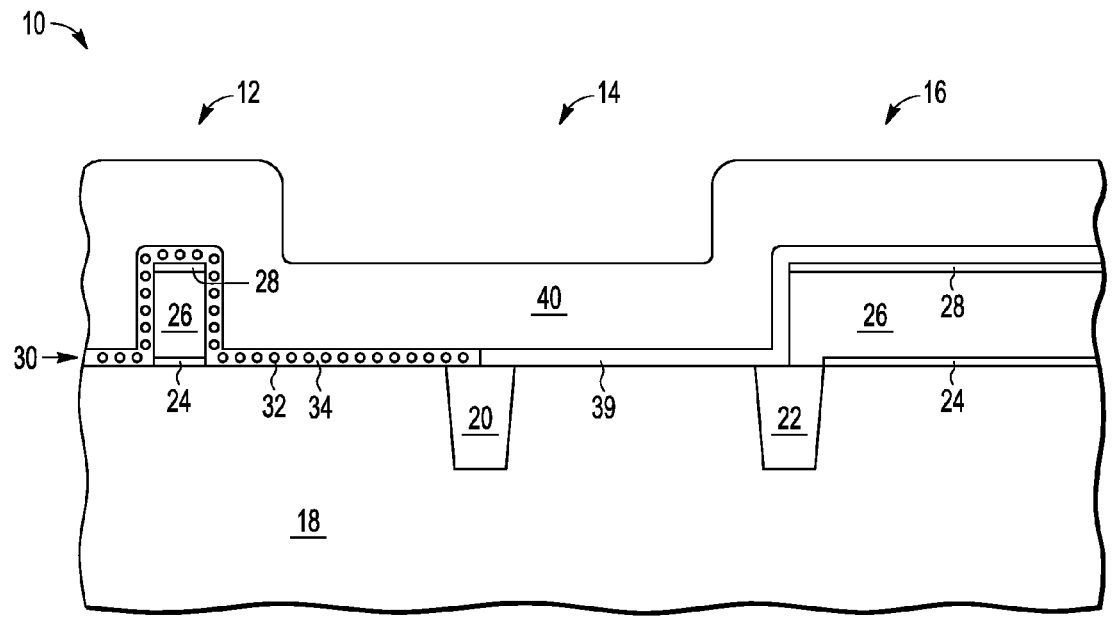
FIG. 5 is a cross section of the semiconductor structure of FIG. 4 at a subsequent stage in processing.

Shown in FIG. 5 is semiconductor structure 10 after depositing a conductive layer 40 on charge storage layer 30 in NVM portion 12 and on dielectric layer 39 in high voltage portion 14 and in logic portion 16.

The structure shown in FIG. 5 can be obtained, alternatively, by depositing a conductive layer before implanting the oxygen. This alternative way of obtaining the structure of FIG. 5 is shown in FIGS. 6 and 7.

Figure 6:
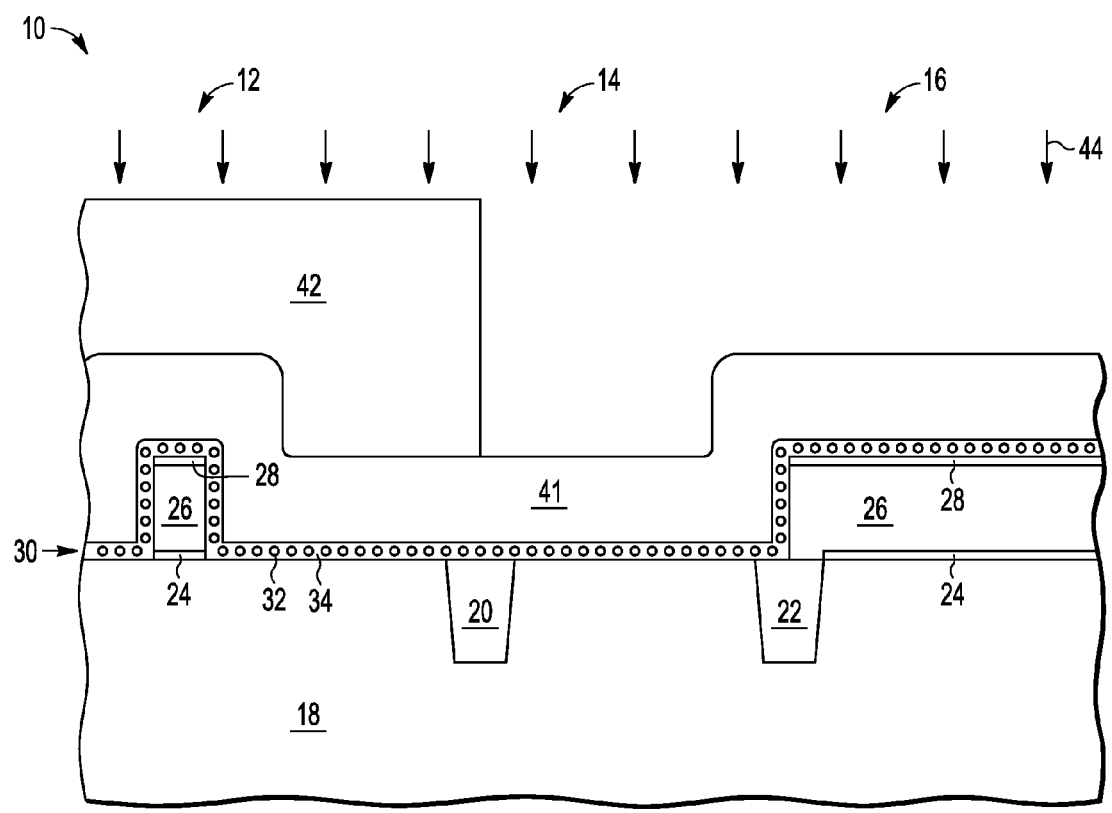
FIG. 6 is a cross section of the semiconductor structure of FIG. 2 at a subsequent stage in processing as an alternative to that shown in FIG. 3 according to a second embodiment.

Shown in FIG. 6 is semiconductor structure 10 of FIG. 3 after forming a conductive layer 41 on charge storage layer 30 in NVM portion 12, high voltage portion 14, and logic portion 16, forming a photoresist mask 42 over NVM portion 12, and performing an implant 44 of oxygen.

Figure 7:
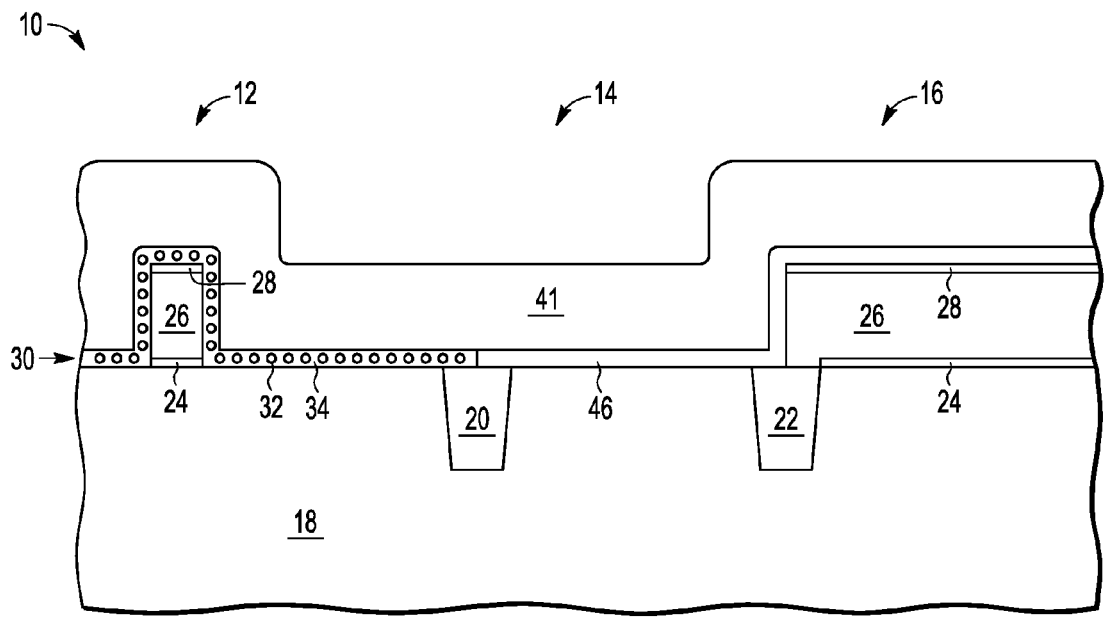
FIG. 7 is a cross section of the semiconductor structure of FIG. 6 at a subsequent stage in processing that substantially achieves the structure of FIG. 5.

Shown in FIG. 7 is semiconductor structure 10 of FIG. 6 after removing photoresist mask 42 and performing an anneal which causes the nanocrystals that were implanted with oxygen to oxidize and form dielectric layer 46. As for the oxidation described for FIG. 4, the anneal is preferably at high temperature, which may be 900 degrees Celsius or more, resulting in dielectric layer having comparable quality to that of thermal oxide. As can be seen, semiconductor structure 10 of FIG. 7 is very similar to semiconductor structure 10 of FIG. 5. Some differences may occur due to, for example, a portion of oxygen implant being in the lower portion of conductive layer 41 which may cause dielectric layer 46 to be thickened compared to dielectric layer 39. This may be advantageous if a thicker dielectric is desired. This amount of thickening may be adjusted by varying the depth of the oxygen implant.

Figure 8:
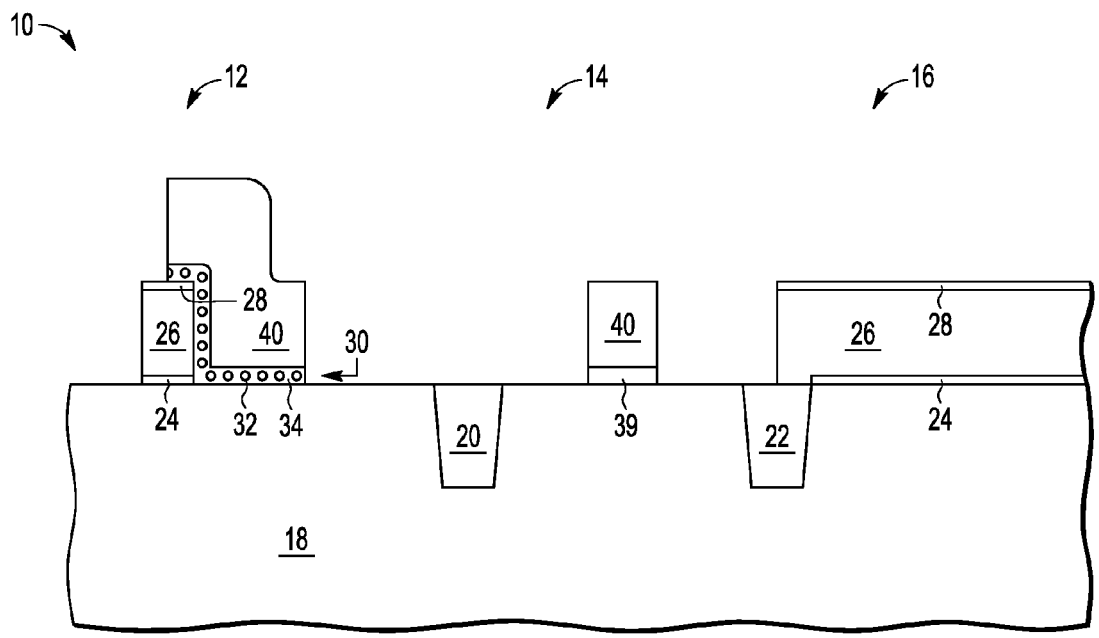
FIG. 8 is a cross section of the semiconductor structure of FIG. 5 at a subsequent stage in processing.

Continuing the flow from semiconductor structure 10 of FIG. 5, shown in FIG. 8 is semiconductor structure 10 of FIG. 5 after patterning conductive layer 40 to form a high voltage gate in high voltage portion 14 and a control gate in NVM portion 12. The portion of conductive layer 40 in NVM portion 12 is the control gate and the portion of conductive layer 40 in high voltage portion 14 is the high voltage gate. Also patterned, in self-aligned fashion, is charge storage layer 30 in NVM portion 12 and dielectric layer 39 in high voltage portion 14. Dielectric layer 39 is removed from logic portion 16.

Figure 9:
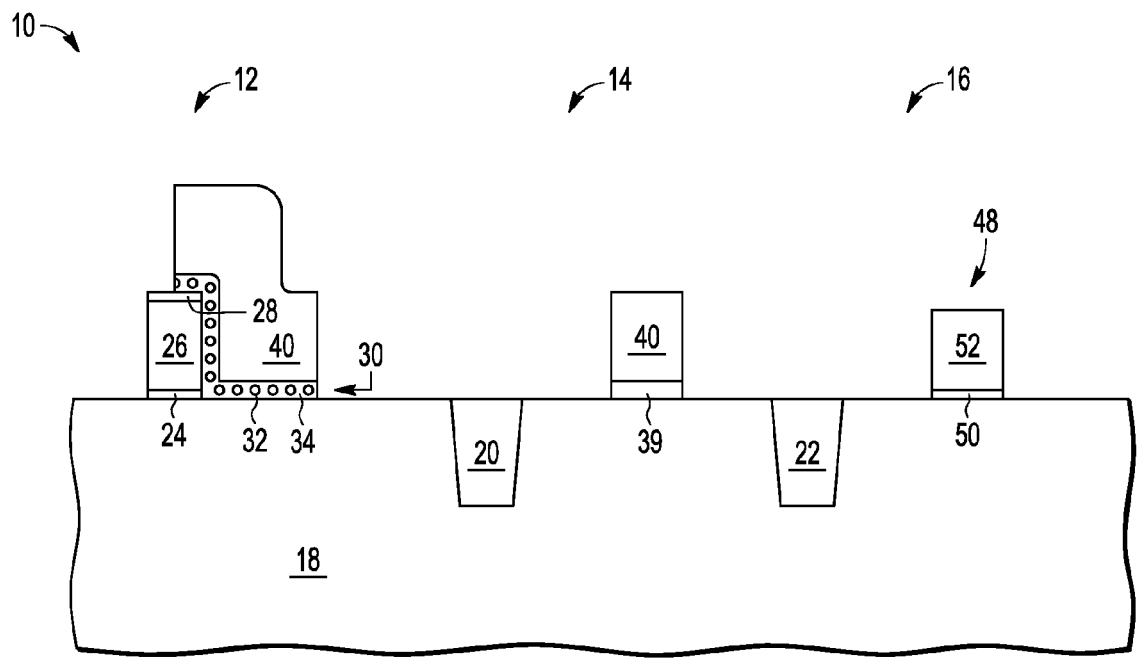
FIG. 9 is a cross section of the semiconductor structure of FIG. 8 at a subsequent stage in processing.

Shown in FIG. 9 is semiconductor structure 10 after removing dielectric layer 28, conductive layer 26, and gate dielectric 24 from logic portion 16 and forming a gate stack 48 having a high k dielectric 50 and a metal gate 52 in logic portion 16. Metal gate 52 may be a stack of conductive layers of which one is metal that sets the work function of the logic transistor to be completed. One of the layers in such a stack may be polysilicon.

Figure 10:
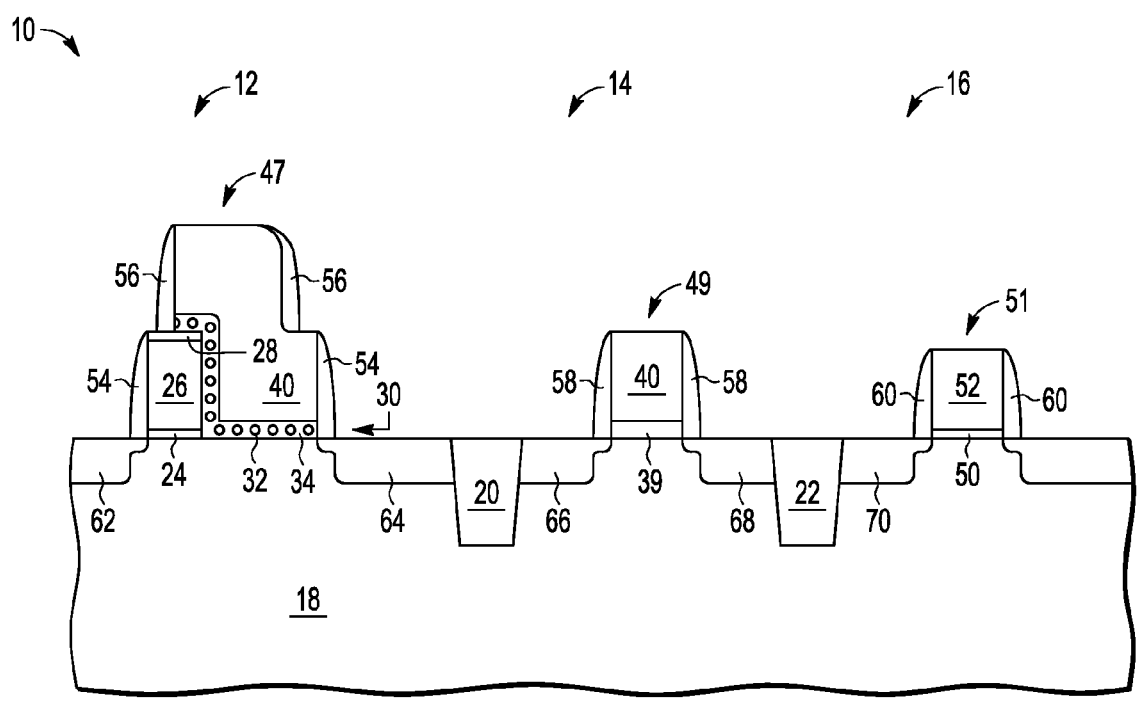
FIG. 10 is a cross section of the semiconductor structure of FIG. 9 at a subsequent stage in processing.

Shown in FIG. 10 is semiconductor structure 10 after forming sidewall spacers and source/drain regions to form an NVM cell 47 in NVM portion 12, a high voltage transistor 49 in high voltage portion 14, and a logic transistor 51 in logic portion 16. In particular, semiconductor 10 is shown after forming sidewall spacer 54 around the select gate and a lower portion of the control gate, a sidewall spacer 56 around an upper portion of the control gate, a sidewall spacer 58 around the high voltage gate, a sidewall spacer 60 around gate 52, source/drain 62 in substrate 18 on the select gate side of NVM cell 47, a source/drain region 64 in substrate 18 on the select gate side, a source/drain region 66 in substrate 18 on one side of high voltage transistor 49, a source/drain region 68 in substrate 18 on an opposing side of high voltage transistor 49, a source/drain region 70 in substrate 18 on one side of logic transistor 51, and source/drain region 72 in substrate 18 on an opposing side of logic transistor 51. The source/drains may be silicided as well as the top polysilicon surfaces. In this case high voltage transistor 49 has a gate of the same material as the control gate of NVM cell 47, which in this example is polysilicon. This has the benefit of not exposing the top surface of the gate dielectric, dielectric 39, to an etchant even if implant 38 of FIG. 3 is used. Implant 38 uses patterned photoresist but the patterning, which removes the undesired portion of the photoresist is not nearly as harsh as a dielectric etch. In the process in which implant 44 is used, conductive layer 41 has the patterned photoresist on it so even the photoresist removal does not contact the top surface of charge storage layer 30 which is converted to dielectric.

Figure 11:
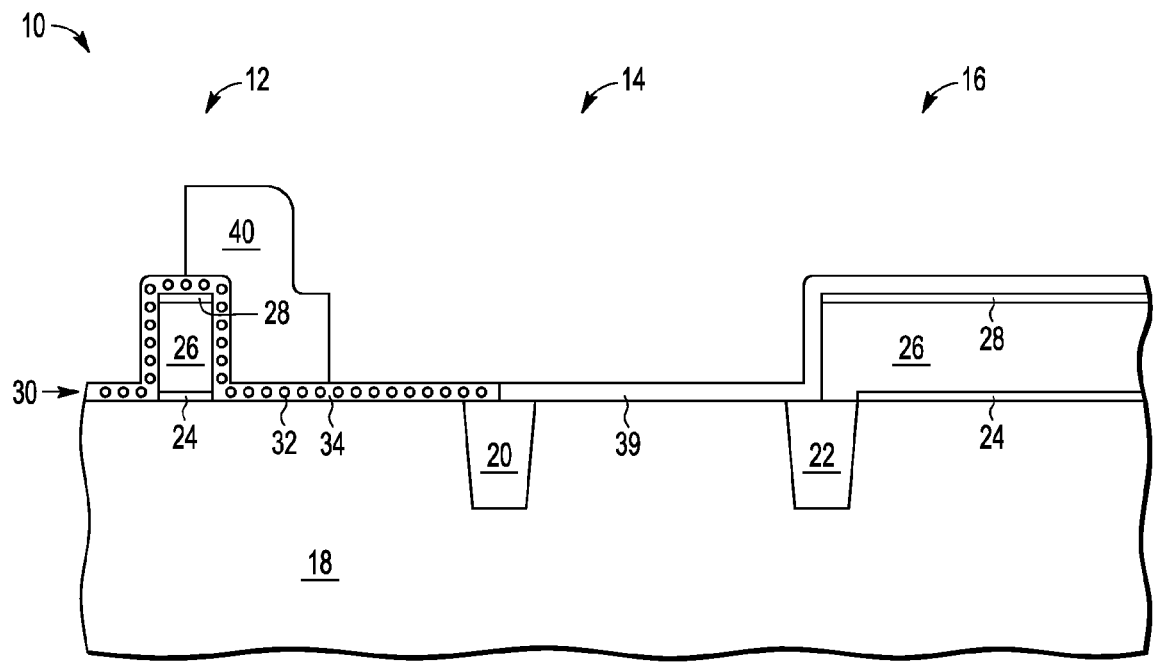
FIG. 11 is a cross section of the semiconductor structure of FIG. 5 at a subsequent stage in processing according to an alternative to the semiconductor structure of FIG. 8.

Shown in FIG. 11 is semiconductor structure 10 of FIG. 7 after a different patterning of conductive layer 40 from that shown in FIG. 8. In FIG. 11 conductive layer 40 in NVM portion 12 is patterned the same as in FIG. 8 but, in addition to conductive layer 40 being removed from logic portion 16, conductive layer 40 is removed from high voltage portion 14.

Figure 12:
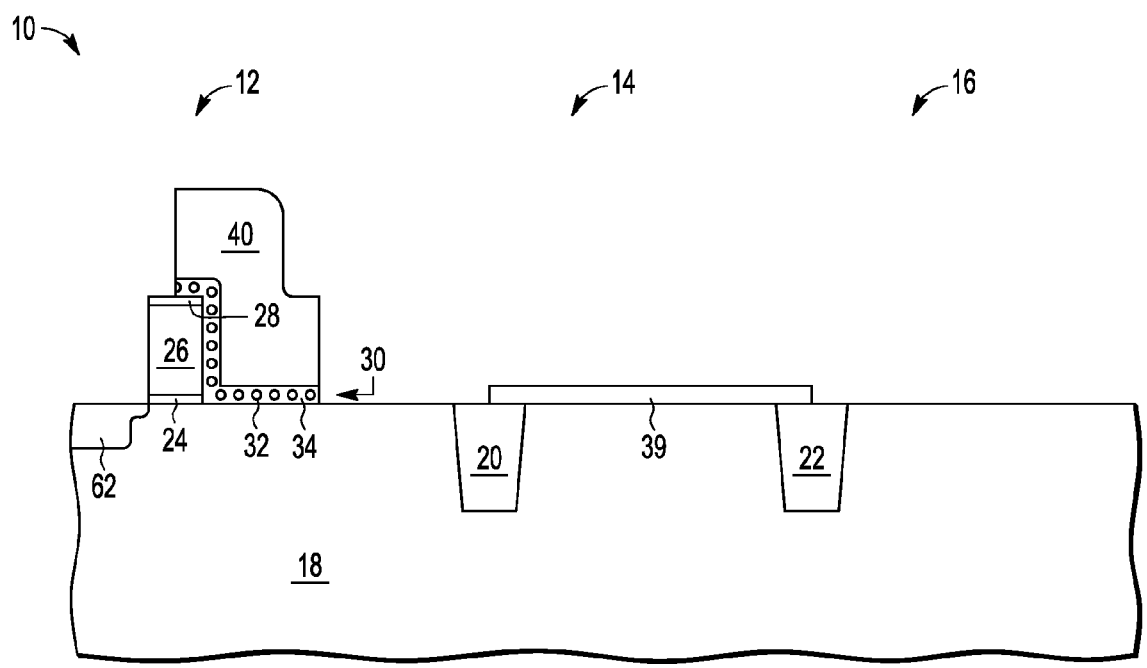
FIG. 12 is a cross section of the semiconductor structure of FIG. 11 at a subsequent stage in processing.

Shown in FIG. 12 is semiconductor structure 10 after removing charge storage layer 30 not covered by the select gate or control gate from NVM portion 12, and dielectric layer 39 from logic portion 16. Also removed is dielectric layer 24, conductive layer 26, and dielectric layer 28 from logic portion 16.

Figure 13:
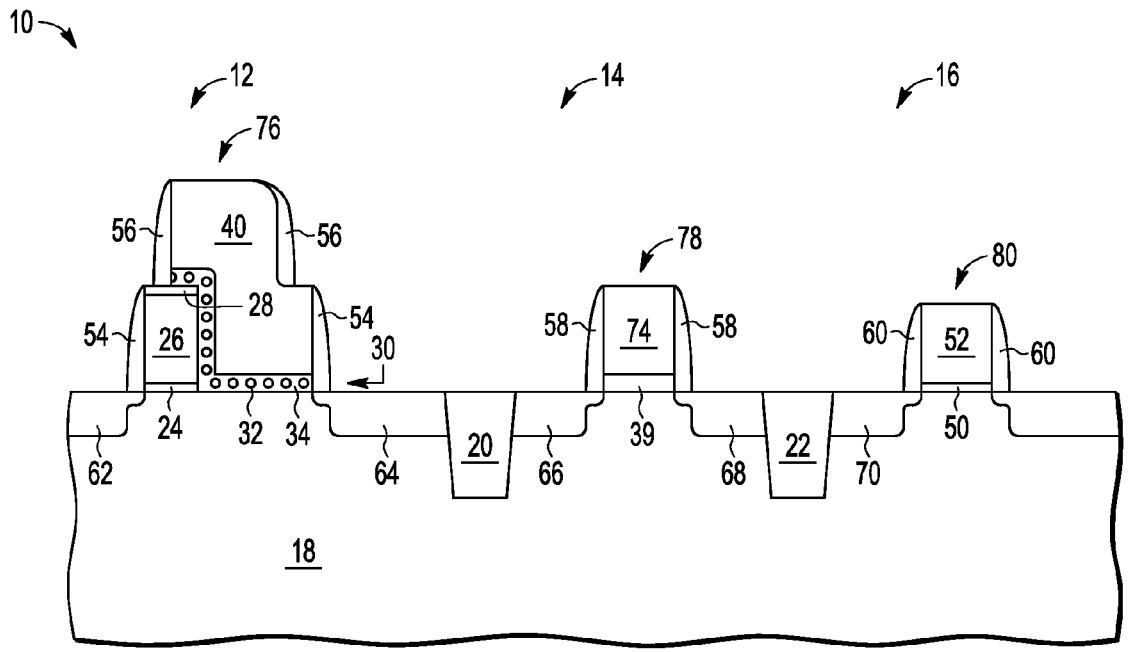
FIG. 13 is a cross section of the semiconductor structure of FIG. 12 at a subsequent stage in processing

Shown in FIG. 13 is semiconductor structure 10 after forming a high voltage gate 74 that is a metal gate, which may be a stack, on dielectric layer 39 in high voltage portion 14, patterning dielectric layer self-aligned to high voltage gate 74 in high voltage portion 14, a high k gate dielectric 50 in logic portion 16, and a metal gate 52 that may be a stack in logic portion 16. Also shown is sidewall spacer and source/drain formation which results in NVM cell 76 in NVM portion 12, high voltage transistor 78 in high voltage portion 14, and logic transistor 80 in logic portion 16. A sidewall spacer 54 is formed around the select gate and a lower portion of the control gate, a sidewall spacer 56 is formed around an upper portion of the control gate, a sidewall spacer 58 is formed around high voltage gate 74, a sidewall spacer 60 is formed around logic gate 52, a source/drain 62 is formed in substrate 18 on the select gate side, a source/drain 64 is formed in substrate 18 on the control gate side, a source/drain 66 is formed on one side of high voltage transistor, a source/drain 68 is formed on an opposing side of high voltage transistor 78, a source/drain region 70 is formed on one side of logic transistor 80, and a source/drain region 72 is formed on an opposing side of logic transistor 80. This shows the formation of a metal gate for high voltage transistor 78. This most likely involves removing polysilicon from dielectric 39 with an etch, which is generally not preferable, but the benefits of using metal gate may make this desirable in some situations.

Figure 14:
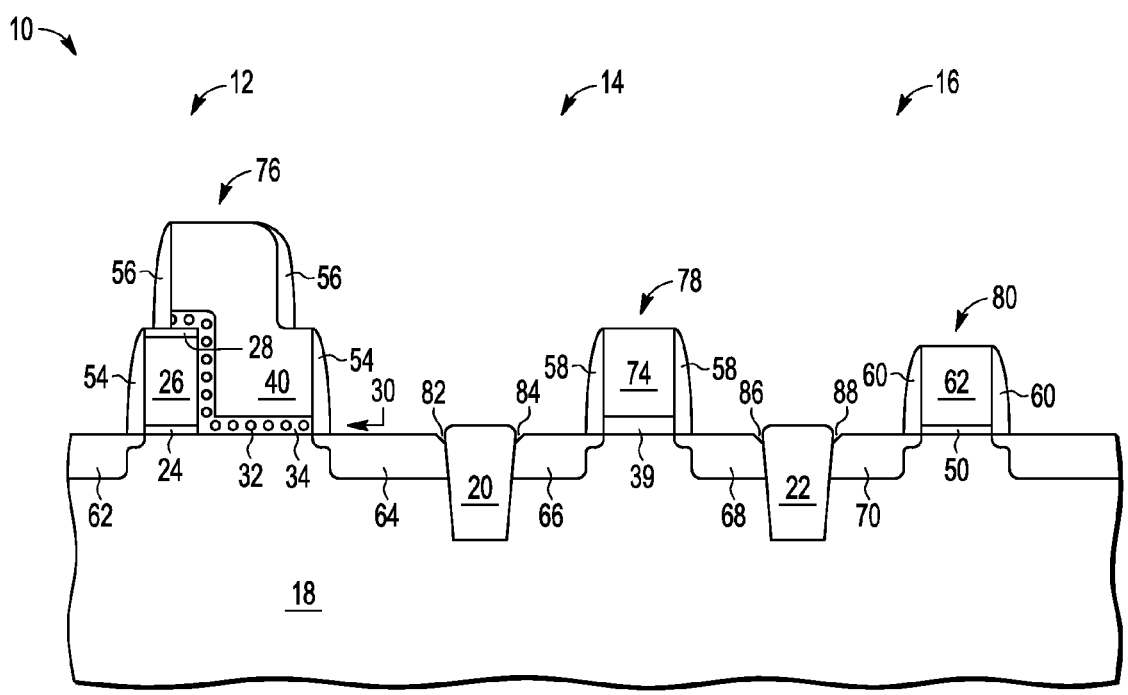
FIG. 14 is a cross section of the semiconductor structure of FIG. 13 in more detail.

Shown in FIG. 14 is semiconductor structure 10 of FIG. 13 with more detail concerning the effects of the different etches that occur in the achieving the resulting structure. The undesirable effects include a notch 82 at an interface of isolation 20 and NVM portion 12, a notch 84 at an interface of isolation portion 20 and high voltage portion 14, a notch 86 at an interface of isolation region 22 and high voltage portion 14, and a notch 88 at an interface of isolation region 22 and logic portion 16. These notches arise mostly from oxide growth and subsequent etches. The notch is bigger when the grown oxide is thicker such as when the gate dielectric for a high voltage transistor is grown. The subsequent etch for removal, which is always occurs at least for patterning, results in lowering the top surface of the semiconductor substrate and notch creation. Semiconductor structure 10 shows comparatively less such lowering in logic portion 16 particularly and also in high voltage portion 14. High voltage gate dielectric 39 is not completely grown. The first portion of charge storage layer 30 is grown but the remainder is not. The upper oxide layer is deposited and the nanocrystals are oxidized using the implanted oxygen. Thus most of the oxide that forms the high voltage gate dielectric is formed from the nanocrystals and deposition instead of consuming substrate 18. With thermal oxide as the base, the subsequent oxides that comprise the majority of the high voltage gate dielectric are brought to a high quality with the high temperature anneal. Memory cell 76 is configured to operate at voltages between 0 and 18 Volts, and logic transistor 80 is configured to operate at voltage between 0 and 3 Volts.

Figure 15:
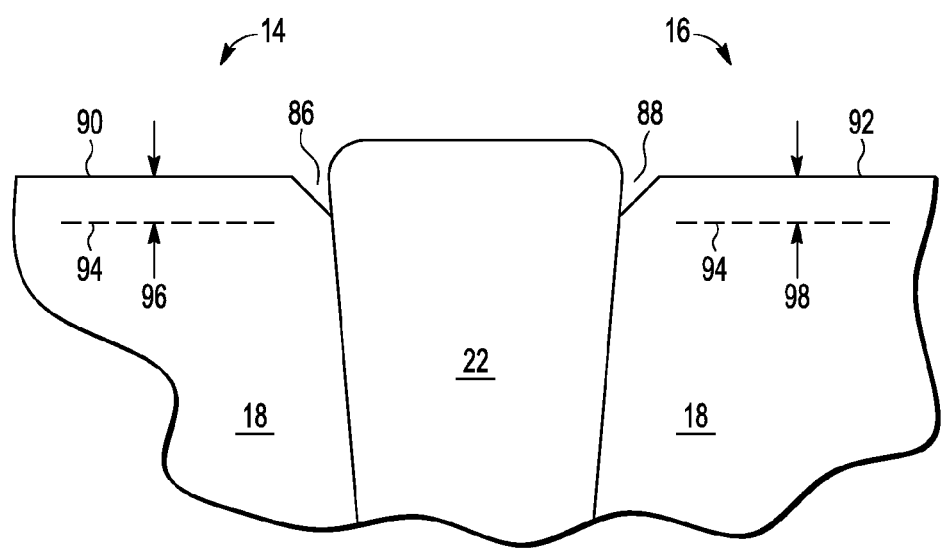
FIG. 15 is cross section of portion of the semiconductor structure of FIG. 14 in more detail.

Shown in FIG. 15 is portion of semiconductor structure 10 of FIG. 14 in more detail showing isolation region 22, notch 86 at the interface of isolation region 22 and high voltage portion 14, notch 88 at the interface of isolation region 22 and logic portion 16, a top surface of substrate 18 in high voltage portion 14 near isolation region 22, a top surface substrate 18 in logic portion 16 near isolation region 22, a line 94 that shows where the top surface of substrate 18 would be if high voltage gate dielectric 39 had been grown in both high voltage portion 14 and logic portion 16, a distance 96 that shows the difference between the actual location of the top surface of substrate 18 and the location where it would be using common thermal oxide growth in high voltage portion 14, and a distance 98 that shows the difference between the actual location of the top surface of substrate 18 and the location where it would be using common thermal oxide growth in high voltage portion 14. Distance 98 is greater than distance 96. Top surface 92 is higher than top surface 90. This is not a normal result. The normal result would be for the top surfaces of the active regions to be nearly equal.

By now it should be appreciated that there has been provided a method of making a semiconductor structure including forming a select gate stack on a substrate, the substrate including a non-volatile memory (NVM) region and a high voltage region, the select gate stack being formed in the NVM region. The method further includes forming a charge storage layer over the NVM region and the high voltage region of the substrate, the charge storage layer including charge storage material between a bottom layer of dielectric material and a top layer of dielectric material. The method further includes oxidizing the charge storage material in the high voltage region while the charge storage material in the NVM region remains unoxidized. The method may further include depositing a protective layer over the NVM region before oxidizing the charge storage material. The method may further include depositing a layer of conductive gate material over the NVM region and the high voltage region and depositing a protective layer over the conductive gate material in the NVM region before oxidizing the charge storage material through the conductive gate material in the high voltage region. The method may have a further characterization by which the charge storage material includes one of a group consisting of: discrete charge storage elements and a layer of conductive film. The method may have a further characterization by which the substrate further includes a logic region and the method further includes depositing a material used for a portion of the select gate stack in the NVM region and the logic region, forming a memory cell including the select gate stack in the NVM region, forming a high voltage transistor in the high voltage region, and forming a logic transistor in the logic region after forming the memory cell and the high voltage transistor and after removing the material used for the select gate stack in the logic region. The method may have a further characterization by which the charge storage layer with the oxidized charge storage material is used as a gate dielectric for a high voltage transistor in the high voltage region. The method may have a further characterization by which the oxidizing the charge storage material includes implanting oxygen in the charge storage layer in the high voltage region and exposing the charge storage layer to heat. The method may have a further characterization by which the memory cell is a split gate memory cell. The method may have a further characterization by which the memory cell is configured to operate at voltages between 0 and 18 Volts and the logic transistor is configured to operate at voltage between 0 and 3 Volts. The method may further include forming a control gate for a memory cell from the layer of conductive gate material in the NVM region and forming a control gate for a high voltage device cell from the layer of conductive gate material in the high voltage region.

Also described is a method of making a semiconductor structure including forming growing a select gate dielectric over a major surface of a substrate. The method further includes depositing a select gate material over the select gate dielectric. The method further includes patterning a select gate stack in a non-volatile memory (NVM) region of the substrate while removing the select gate dielectric and the select gate material in a high voltage region of the substrate and retaining the select gate dielectric and the select gate material in a logic region of the substrate. The method further includes depositing a charge storage layer over the NVM region, the high voltage region, and the logic region. The method further includes forming a protective layer over the charge storage layer in the NVM region. The method further includes oxidizing the charge storage layer in the high voltage region and the logic region while the protective layer prevents the charge storage layer from oxidizing in the NVM region. The method may further include depositing a control gate material over the charge storage layer before the forming the protective layer and the oxidizing the charge storage layer.

The method may further include patterning the control gate material and the charge storage layer in the NVM region to form a control gate partially overlapping the select gate stack. The method may further include patterning the control gate material and the oxidized charge storage layer in the high voltage region to form a gate for a high voltage device. The method may further include removing the select gate dielectric and the select gate material in the logic region of the substrate and forming a gate stack in the logic region after the removing the select gate dielectric and the select gate material in the logic region.

Described also is a semiconductor structure that includes a substrate including a non-volatile memory (NVM) region, a high voltage region and a logic region. The semiconductor structure further includes an NVM cell configured in the NVM region. The semiconductor structure further includes a high voltage device configured in the high voltage region. The semiconductor structure further includes a logic device configured in the logic region. The semiconductor structure further includes a first trench isolation region between the NVM region and the high voltage region. The semiconductor structure further includes a second trench isolation region between the high voltage region and the logic region. The semiconductor structure further includes a height of a major surface of the substrate abutting the second trench isolation region in the high voltage region is less than a height of the major surface of the substrate abutting the second trench isolation region in the logic region. The semiconductor structure may further include a select gate, a control gate overlapping a portion of the select gate, and a charge storage layer between the select gate and the control gate. The semiconductor structure may have a further characterization by which the high voltage device further includes a gate dielectric formed of an oxidized portion of the charge storage layer. The semiconductor structure may have a further characterization by which the NVM cell is configured to operate at voltages between 0 and 18 Volts, the high voltage device is configured to operate at voltages between 0 and 18 Volts, and the logic device is configured to operate at voltage between 0 and 3 Volts. The semiconductor structure may have a further characterization by which the charge storage layer includes one of a group consisting of: discrete charge storage elements between top and bottom dielectric layers, and a layer of conductive film between top and bottom dielectric layers.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example there may be additional transistor types and there may be additional gate dielectric thicknesses from those shown. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

What is claimed is:

1. A method of making a semiconductor structure comprising:
    forming a select gate stack on a substrate, the substrate including a non-volatile memory (NVM) region and a high voltage region, the select gate stack being formed in the NVM region;
    forming a charge storage layer over the NVM region and the high voltage region of the substrate, the charge storage layer including charge storage material; and
    oxidizing the charge storage material in the high voltage region while the charge storage material in the NVM region remains unoxidized.

2. The method of claim 1 further comprising:
    depositing a protective layer over the NVM region before oxidizing the charge storage material.

3. The method of claim 1 further comprising:
    depositing a layer of conductive gate material over the NVM region and the high voltage region; and
    depositing a protective layer over the conductive gate material in the NVM region before oxidizing the charge storage material through the conductive gate material in the high voltage region.

4. The method of claim 1 wherein the charge storage material includes one of a group consisting of: discrete charge storage elements and a layer of conductive film.

5. The method of claim 1, wherein the substrate further includes a logic region, the method further comprising:
    depositing a material used for a portion of the select gate stack in the NVM region and the logic region;
    forming a memory cell including the select gate stack in the NVM region;
    forming a high voltage transistor in the high voltage region; and
    forming a logic transistor in the logic region after forming the memory cell and the high voltage transistor and after removing the material used for the select gate stack in the logic region.

6. The method of claim 1 wherein the charge storage layer with the oxidized charge storage material is used as a gate dielectric for a high voltage transistor in the high voltage region.

7. The method of claim 1 where the oxidizing the charge storage material comprises:
    implanting oxygen in the charge storage layer in the high voltage region; and
    exposing the charge storage layer to heat.

8. The method of claim 5 wherein the memory cell is a split gate memory cell.

9. The method of claim 5, wherein:
    the memory cell is configured to operate at voltages between 0 and 18 Volts;
    the high voltage transistor is configured to operate at voltages between 0 and 18 Volts; and
    the logic transistor is configured to operate at voltage between 0 and 3 Volts.

10. The method of claim 3 further comprising:
forming a control gate for a memory cell from the layer of conductive gate material in the NVM region; and
forming a control gate for a high voltage device cell from the layer of conductive gate material in the high voltage region.

11. A method of making a semiconductor structure comprising:
growing a select gate dielectric over a major surface of a substrate;
depositing a select gate material over the select gate dielectric;
patterning a select gate stack in a non-volatile memory (NVM) region of the substrate while removing the select gate dielectric and the select gate material in a high voltage region of the substrate and retaining the select gate dielectric and the select gate material in a logic region of the substrate;
depositing a charge storage layer over the NVM region, the high voltage region, and the logic region;
forming a protective layer over the charge storage layer in the NVM region; and
oxidizing the charge storage layer in the high voltage region and the logic region while the protective layer prevents the charge storage layer from oxidizing in the NVM region.

12. The method of claim 11 further comprising:
depositing a control gate material over the charge storage layer before the forming the protective layer and the oxidizing the charge storage layer.

13. The method of claim 11 further comprising:
patterning the control gate material and the charge storage layer in the NVM region to form a control gate partially overlapping the select gate stack.

14. The method of claim 13 further comprising:
patterning the control gate material and the oxidized charge storage layer in the high voltage region to form a gate for a high voltage device.

15. The method of claim 14 further comprising:
removing the select gate dielectric and the select gate material in the logic region of the substrate; and
forming a gate stack in the logic region after the removing the select gate dielectric and the select gate material in the logic region.

* * * * *